(12) United States Patent
Dutta et al.

(10) Patent No.: US 11,937,435 B2
(45) Date of Patent: Mar. 19, 2024

(54) HIGH DENSITY TWO-TIER MRAM STRUCTURE

(71) Applicant: International Business Machines Corporation, Armonk, NY (US)

(72) Inventors: Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 17/513,273

(22) Filed: Oct. 28, 2021

(65) Prior Publication Data

US 2023/0133023 A1 May 4, 2023

(51) Int. Cl.
| | |
|---|---|
| H10B 61/00 | (2023.01) |
| H10N 50/01 | (2023.01) |
| H10N 50/80 | (2023.01) |
| H10N 50/85 | (2023.01) |

(52) U.S. Cl.
CPC ............ *H10B 61/00* (2023.02); *H10N 50/01* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 6,567,300 B1 | 5/2003 | Raberg | |
| 9,343,659 B1 | 5/2016 | Lu | |
| 9,704,919 B1 | 7/2017 | Lu | |
| 10,262,715 B2 | 4/2019 | Bedeschi | |
| 10,446,743 B2 | 10/2019 | Li | |
| 10,868,236 B2 | 12/2020 | Shrivastava | |
| 11,251,362 B2* | 2/2022 | Wu | H10N 50/01 |
| 2003/0214835 A1* | 11/2003 | Nejad | G11C 11/16 365/158 |
| 2012/0273844 A1 | 11/2012 | Iwayama | |
| 2013/0119494 A1 | 5/2013 | Li | |
| 2014/0264670 A1* | 9/2014 | Annunziata | H10N 50/01 257/421 |
| 2015/0070979 A1* | 3/2015 | Zhu | G11C 11/1695 365/158 |
| 2016/0365505 A1 | 12/2016 | Lu | |
| 2019/0214554 A1* | 7/2019 | Li | G11C 11/1673 |
| 2020/0035683 A1 | 1/2020 | Sharma | |
| 2021/0408013 A1* | 12/2021 | Young | G11C 11/161 |
| 2022/0254396 A1* | 8/2022 | Dutta | H10B 61/22 |
| 2023/0309320 A1* | 9/2023 | Wu | G11C 11/1659 |

* cited by examiner

*Primary Examiner* — Michael Lebentritt
(74) *Attorney, Agent, or Firm* — Gavin Giraud (57) ABSTRACT

Embodiments disclosed herein include a semiconductor structure. The semiconductor structure may include a semiconductor structure. The semiconductor structure may include an embedded magnetic random access memory (MRAM) array electrically connected between a bottom metal level and a top metal level. The MRAM array may include a first tier with first MRAM cells and first vias above the first MRAM cells, and a second tier with second MRAM cells and second vias below the second MRAM cells.

24 Claims, 5 Drawing Sheets

HIGH DENSITY TWO-TIER MRAM STRUCTURE

BACKGROUND

The present invention relates generally to the field of magnetic random access memory (MRAM), and more particularly to a multiple-tier MRAM structure that increases density of MRAM cells without suffering from shorting.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The magnetization of the other plate can be changed to match that of an external field to store memory. Cell density is a high determinant for performance and cost in a memory system. Smaller, fewer, or more tightly packed MRAM cells mean that more memory storage can be produced at once from a single silicon wafer, and devices that use the memory will have more storage capacity.

SUMMARY

Aspects of an embodiment of the present invention include a semiconductor structure. The semiconductor structure may include an embedded magnetic random access memory (MRAM) array electrically connected between a bottom metal level and a top metal level. The MRAM array may include a first tier with first MRAM cells and first vias above the first MRAM cells, and a second tier with second MRAM cells and second vias below the second MRAM cells.

Aspects of an embodiment of the present invention include methods of fabricating a semiconductor structure. The methods may include forming a lower tier of magnetic random access memory (MRAM) cells above a first set of landing pads of a bottom metal level and forming lower vias through a first interlayer dielectric (ILD) covering the first tier of MRAM cells. The lower vias may contact a second set of landing pads of the bottom metal level. The methods may also include forming an upper tier of MRAM cells on the lower vias, covering the upper tier of MRAM cells with a second ILD, and forming upper vias through the second ILD and the first ILD. The upper vias may contact the lower tier of MRAM cells. The methods may also include forming a top metal level above the second set of vias and the second tier of MRAM cells.

Aspects of an embodiment of the present invention include a semiconductor structure. The semiconductor structure may include a bottom metal level and a top metal level. The semiconductor structure may also include a first tier of magnetic random access memory (MRAM) cells electrically connected between the bottom metal level and the top metal level and a second tier of MRAM cells electrically connected between the bottom metal level and the top metal level. The second tier of MRAM cells are vertically above the first tier of MRAM cells, and each MRAM cell in the second tier of MRAM cells laterally overlaps at least one MRAM cell in the first tier of MRAM cells.

DETAILED DESCRIPTION

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

In the fabrication of embedded magnetic random access memory (MRAM) devices within the metal contact layers of a semiconductor structure, an MRAM pillar is formed as part of the MRAM cell. Due to the presence of various dielectric materials, the formation of the MRAM pillar typically involves a directed physical etch rather than an etch selective chemical process. For example, the directed etch may include ion beam etch (IBE). Such directed etch processes can be challenging to complete at small pitch due to shadowing of pillars, which makes cleaning the sidewall of the pillar difficult. The embodiments disclosed herein, therefore, include multiple tiers of MRAM pillars. Each tier has a MRAM pillar pitch that is spaced apart enough for the directed etch to avoid problems caused by shadowing of pillars, but the contacts of the individual embedded pillars achieve a tighter device pitch, and the semiconductor structure overall fits more MRAM devices within the metal contact layers.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, landing pad 106 may refer to a single landing pad 106 or multiple landing pads 106.

The present invention will now be described in detail with reference to the Figures.

Figure 1:
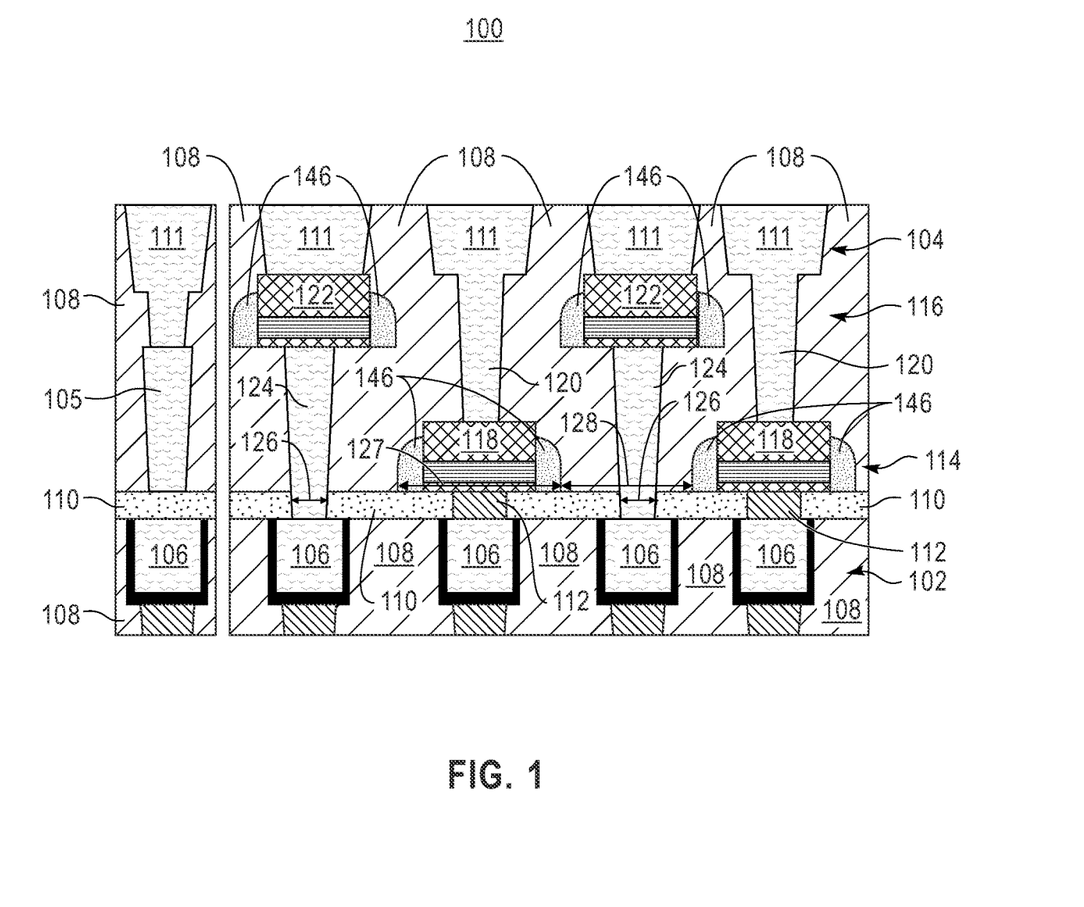
FIG. 1 depicts schematic cross-sectional diagram of a semiconductor structure, in accordance with one embodiment of the present invention.

FIG. 1 depicts a schematic view of a semiconductor structure 100 with two metal levels: a bottom metal level 102 and a top metal level 104. The metal levels 102, 104 may, for example, be consecutive back-end-of line (BEOL) layers in a logic area of the semiconductor structure 100. The semiconductor structure 100 may include a logic contact 105 that is also positioned between the bottom metal level 102 and the top metal level 104. The bottom metal level 102 includes landing pads 106 that are connected to an additional metal level below the bottom metal level 102, or a front end of line (FEOL) level comprising transistor devices (not shown) located below the bottom metal level 102. The landing pads 106 may be formed of electrically conductive materials such as copper, tungsten, cobalt, ruthenium, aluminum, other metals, or conductive non-metals. The landing pads 106 are insulated from other components by interlayer dielectric (ILD) 108 and a dielectric cap 110. The ILD 108 may include a non-crystalline solid material such as silicon dioxide ($SiO_2$) undoped silicate glass (USG), tetraethyl orthosilicate (TEOS), low-κ dielectric, or ultra low-κ dielectric materials, fluorosilicate glass (FSG), borophosphosilicate glass (BPSG), a spin-on low-κ dielectric layer, a chemical vapor deposition (CVD) low-κ dielectric layer or any combination thereof. The term "low-κ" as used in the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD 108. The use of a self-planarizing dielectric material as ILD 108 may avoid the need to perform a subsequent planarizing step. The dielectric cap 110 may include SiN, SiC, SiCN(H), or other silicon compounds for insulating. The top metal level 104 includes metalized trenches 111 that are also formed of electrically conductive materials such as copper, tungsten, cobalt, ruthenium, aluminum, other metals, or conductive non-metals.

In the illustrated embodiment of FIG. 1, a subset of the landing pads 106 include contact pads 112 that electrically connects the landing pad 106 to magnetic random access memory (MRAM) components of the semiconductor structure 100. Specifically, the contact pads 112 are connected to a first tier 114 of MRAM cells 118 electrically connected between the bottom metal level 102 and the top metal level 104. A second tier 116 of MRAM cells 122 is also electrically connected between the bottom metal level 102 and the top metal level 104. The first tier 114 and second tier 116 are separated by ILD 108 (which may have the same chemical composition as the ILD 108 below the dielectric cap 110, or different chemical composition), and are formed to increase the device density for the semiconductor structure 100 without suffering detrimental effects from shadowing of pillars. In certain embodiments, the semiconductor structure 100 may include a third tier, fourth tier, etc. without deviating from the disclosed embodiments.

The first tier 114 includes first (lower) MRAM cells 118 and first (upper) vias 120 above the first MRAM cells 118. The second tier 116 includes second (upper) MRAM cells 122 and second (lower) vias 124 below the second MRAM cells 122. The first tier 114 has the first (lower) MRAM cells 118 directly connected to the contact pads 112, while the second tier 116 has the second vias 124 directly connected to the contact pads 112. The vias 120, 124 have a width 126 that is laterally narrower than a width 127 of the MRAM cells 118, 122, and therefore the vias 120, 124 are able to fit within lateral space 128 between the MRAM cells 118, 122. Specifically, the second (lower) vias 124 fit between the first (lower) MRAM cells 118 and the first (upper) vias 120 fit between the second (upper) MRAM cells 122. The second (upper) MRAM cells 122, therefore, are able to laterally overlap the first (lower) MRAM cells 118, which increases device density. That is, if the first tier 114 and the second tier 116 were both directly connected to the contact pads 112 or the landing pads 106 (i.e., without the second (lower) vias 124), the second (upper) MRAM cells 122 would short to the first (lower) MRAM cells 118 due to the close proximity. Since the first MRAM cells 118 are vertically separated from the second MRAM cells 122 by the ILD 108, however, the MRAM cells 118, 122 do not short, but each landing pad 106 is able to electrically signal an individual MRAM cell 118, 122.

Figure 2:
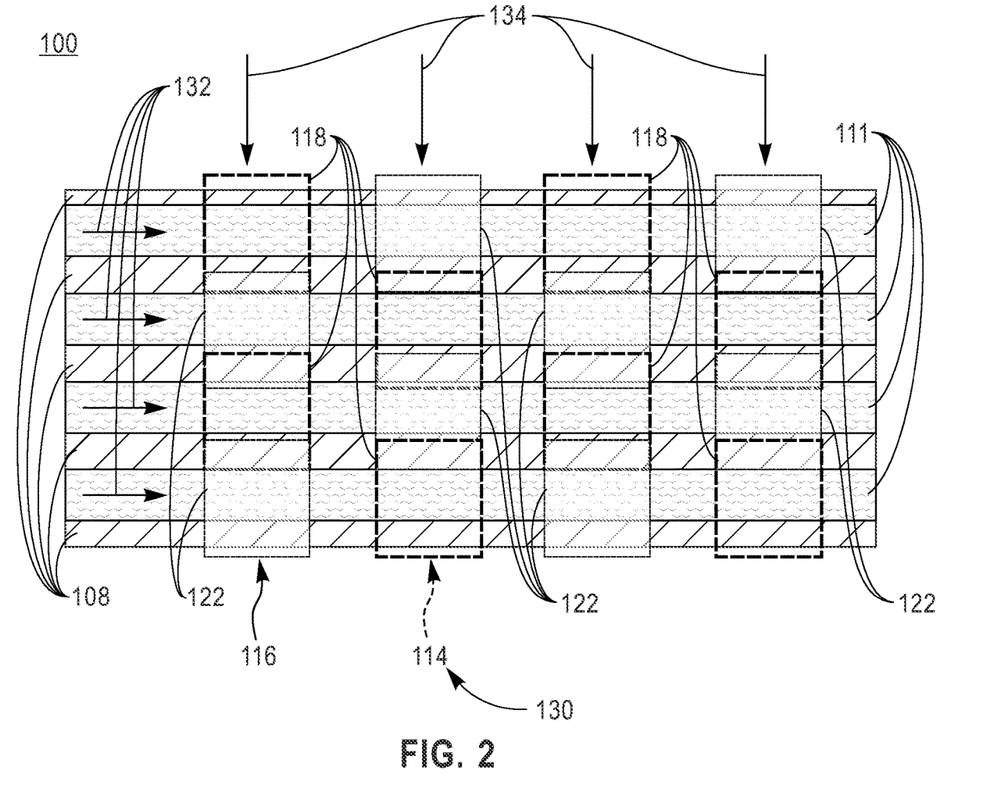
FIG. 2 depicts a schematic top view of the semiconductor structure of FIG. 1, in accordance with one embodiment of the present invention.

FIG. 2 depicts a schematic top view of the semiconductor structure 100 of FIG. 1, in accordance with one embodiment of the present invention. While FIG. 2 does not illustrate all components of the semiconductor structure 100, FIG. 2 does show that the semiconductor structure 100 may have the MRAM cells 118, 122 arranged as an embedded MRAM array 130 having rows 132 and columns 134 below the trenches 111 of the top metal level 104. Each row 132 and column 134 of the embedded MRAM array 130 may alternate between first (lower) MRAM cells 118 and second (upper) MRAM cells 122. This alternating between MRAM cells 118, 122 means that each first (lower) MRAM cell 118 is adjacent only to a second (upper) MRAM cell 122 along the columns 134, as illustrated in FIG. 1, but also along the rows 132. The embedded MRAM array 130 with multiple-tier MRAM cell fabrication thus saves lateral area within the semiconductor structure 100 by shifting some of the MRAM cells (i.e., second (upper) MRAM cells 122) into the vertical direction. The device density of the embedded MRAM array 130, therefore, is two times the device density of the first tier 114, and two times the device density of the second tier 116. It is possible that formation of additional tiers of MRAM cells may further increase the device density relative to each individual tier.

Figure 3:
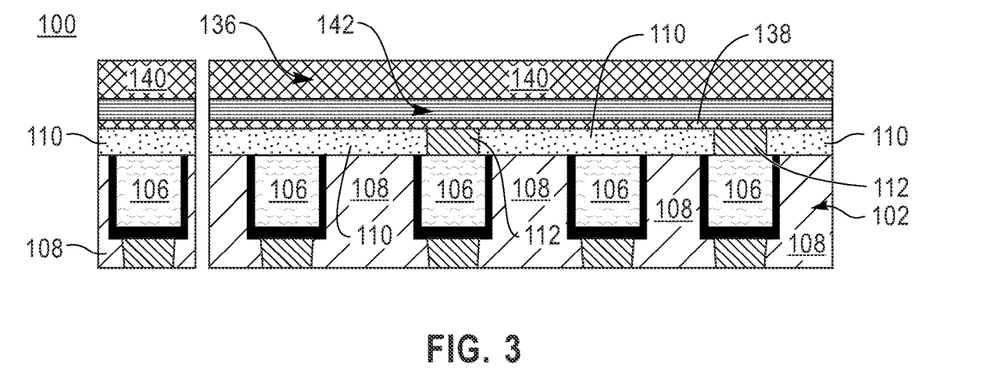
FIG. 3 depicts a schematic cross-sectional diagram of a semiconductor structure, in accordance with one embodiment of the present invention.

The following description related to FIGS. 3-8 will detail a possible fabrication method for the semiconductor structure 100. FIG. 3 depicts a schematic cross-sectional diagram of the semiconductor structure 100, in accordance with one embodiment of the present invention. The semiconductor structure 100 includes the bottom metal level 102 with the landing pads 106 separated/insulated by the interlayer dielectric (ILD) 108 and the dielectric cap 110. Above the dielectric cap 110, the semiconductor structure 100 includes blanket layers 136 of magnetic random access memory (MRAM) material. The blanket layers 136 may be fabricated using known deposition processes such as chemical vapor deposition (CVD), atomic layer deposition (ALD), and/or physical vapor deposition (PVD). The blanket layers 136 may include, a bottom MRAM electrode layer 138 and a top MRAM electrode layer 140 formed from Nb, NbN, W, WN, Ta, TaN, Ti, TiN, Ru, Mo, Cr, V, Pd, Pt, Rh, Sc, Al and other high melting point metals or conductive metal nitrides. MRAM layers 142 may include magnetic tunnel junction (MTJ) material that enables a magnetic field to change based on electric signals sent through an MRAM cell. The MRAM layers 142 may include reference layers, tunnel barriers, and free layers. The reference layers may be made of a ferromagnetic material such as NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. The ferromagnetic material enables a permanent magnetic field to be maintained in a fixed orientation. For example, the magnetic field may be fixed in a down orientation. The tunnel barriers may be made of magnesium oxide, magnesium aluminum oxide, aluminum oxide, combinations of these, or other dielectric materials. The free layers may be made of a magnetic material that enables the magnetic orientation to switch depending on a signal passed vertically through the finished MRAM cells 118. In general, the free layers include a ferromagnetic layer capable of changed in magnetization state. In some embodiments, the free layers are a composite free layer that includes multiple ferromagnetic and coupling sub-layers.

Figure 4:
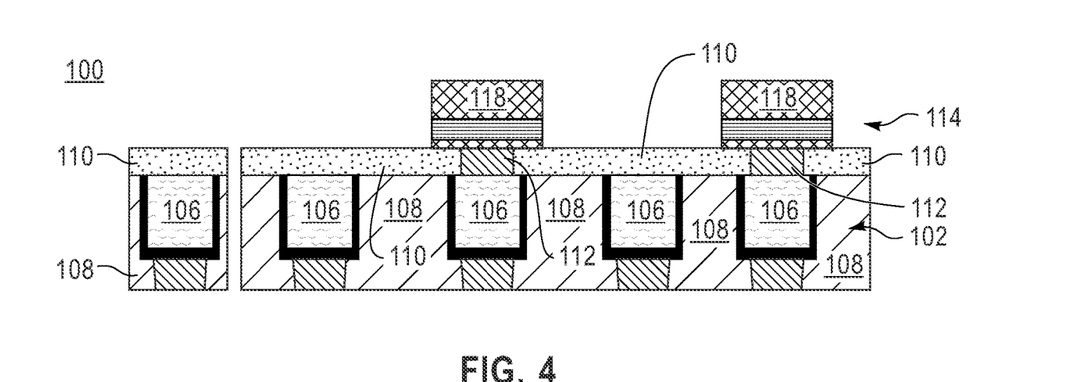
FIG. 4 depicts a schematic cross-sectional diagram of the semiconductor structure of FIG. 3, in accordance with one embodiment of the present invention.

FIG. 4 depicts a schematic cross-sectional diagram of the semiconductor structure of FIG. 1, in accordance with one embodiment of the present invention. FIG. 4 shows the formation of a lower tier 114 of magnetic random access memory (MRAM) cells 118 above a first set 144 of landing pads 106 of the bottom metal level 102. The semiconductor structure 100 includes contact pads 112 only over the first set 144 of landing pads 106. The contact pads 112 ensure that the MRAM cells 118 are electrically connected to the landing pads 106. The MRAM cells 118 may be formed by etching away portions of the blanket layers 136 that are not part of the lower tier 114 of the MRAM cells 118. In some embodiments, this etching of MRAM cell can be performed using Ion Beam Etch (IBE). IBE can cause ineffective etch due to shadowing if the pitch of the MRAM cells 118 is too small. The pitch of the MRAM cells 118 may be determined by the smallest distance at which the shadowing problem is not prohibitive. Masking material (not shown) may be applied to the top of the semiconductor structure 100 (i.e., to the top of the blanket layers 136), prior to etching, which resists etching and can be utilized to form the desired shape of the MRAM cells 118. In some embodiments, the masking material may be a photoresist which has been patterned using photolithography on top of an organic planarizing material (OPL) and an inorganic hardmask (SiOx, SiN, SiC etc.). Photoresist pattern is transferred to hardmaks and OPL and top electrode 118 using an anisotropic etch such as reactive ion etching (RIE). This pattern is then used as mask for IBE to etch the final MRAM cells 118.

Figure 5:
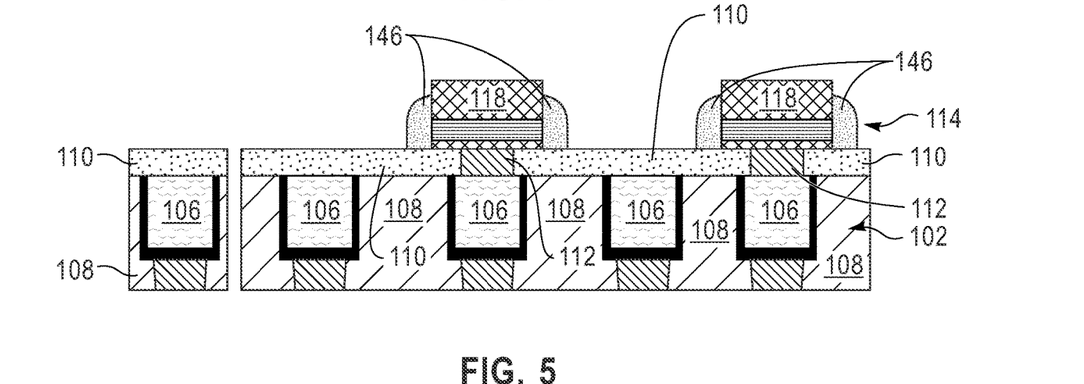
FIG. 5 depicts a schematic cross-sectional diagram of the semiconductor structure of FIG. 3, in accordance with one embodiment of the present invention.

FIG. 5 depicts a schematic cross-sectional diagram of the semiconductor structure 100 of FIG. 1, in accordance with one embodiment of the present invention. FIG. 5 shows encapsulating the first tier of MRAM cells 118 with an encapsulation spacer 146. The encapsulation spacer 146 may be formed of the same or similar material to the dielectric cap 110, namely SiN, SiC, SiCN(H), or other silicon compounds for insulating. Encapsulating with the encapsulation spacer 146 may include a blanket deposition of the encapsulation material followed by etching back the encapsulation spacer 146. The etch back of the encapsulation material may be done using anisotropic etch processes.

Figure 6:
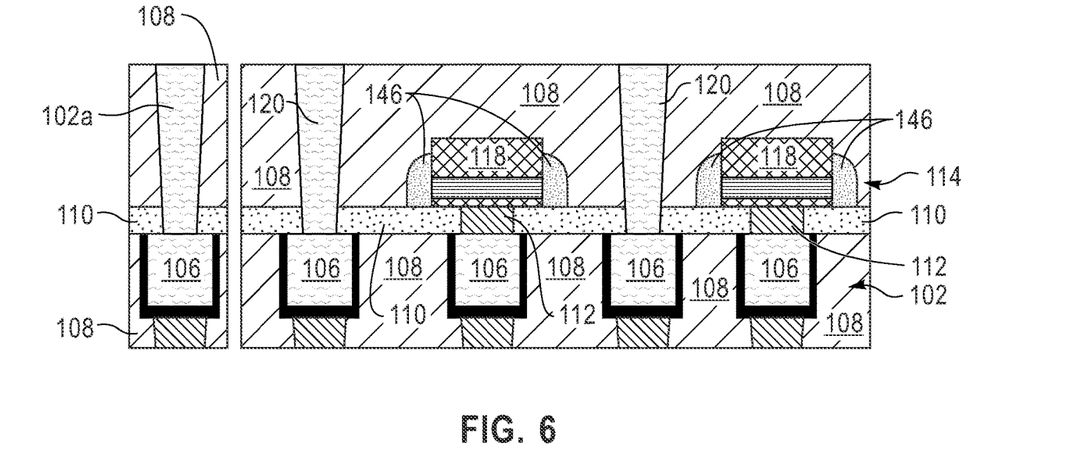
FIG. 6 depicts a schematic cross-sectional diagram of the semiconductor structure of FIG. 3, in accordance with one embodiment of the present invention.

FIG. 6 depicts a schematic cross-sectional diagram of the semiconductor structure 100 of FIG. 1, in accordance with one embodiment of the present invention. Following the etch back of the encapsulation spacers 146, the semiconductor structure 100 may then have additional ILD 108 cover the bottom metal level 102 and the first tier 114 of MRAM cells 118. After this additional ILD 108 is formed, fabrication of the semiconductor structure 100 may include forming lower vias 120 through the ILD 108 covering the first tier of MRAM cells 118. The lower vias 120 may contact a second set 148 of landing pads 106 of the bottom metal level 102. The lower vias 120 are also formed through the dielectric cap 110, but in certain embodiments (like the embodiment of FIG. 1) the lower vias 120 may be formed to connect to additional contact pads 112. The lower vias 120 may include a logic via 120a for the logic circuit as well.

Figure 7:
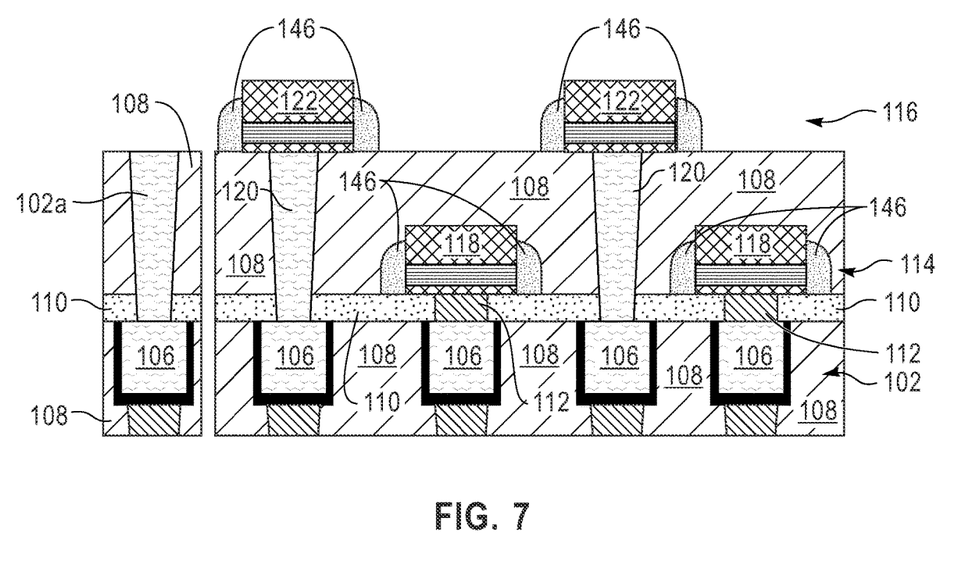
FIG. 7 depicts a schematic cross-sectional diagram of the semiconductor structure of FIG. 3, in accordance with one embodiment of the present invention.

FIG. 7 depicts a schematic cross-sectional diagram of the semiconductor structure of FIG. 1, in accordance with one embodiment of the present invention. After the lower vias 120 are formed through the ILD 108, the semiconductor structure 100 may have a second tier 116 having upper MRAM cells 122 formed on the top surface of the ILD 108. The upper MRAM cells 122 may be formed similarly to the lower MRAM cells 118. That is, the upper MRAM cells 122 may be formed using additional blanket layers (bottom MRAM electrode layer, top MRAM electrode layer, and MRAM layer) using IBE followed by etching and encapsulation with encapsulation spacers 146 as described above. The upper MRAM cells 122 may be formed with a pitch that is also determined by the limit of the shadowing of the IBE technique used to etch MRAM cells 122.

Figure 8:
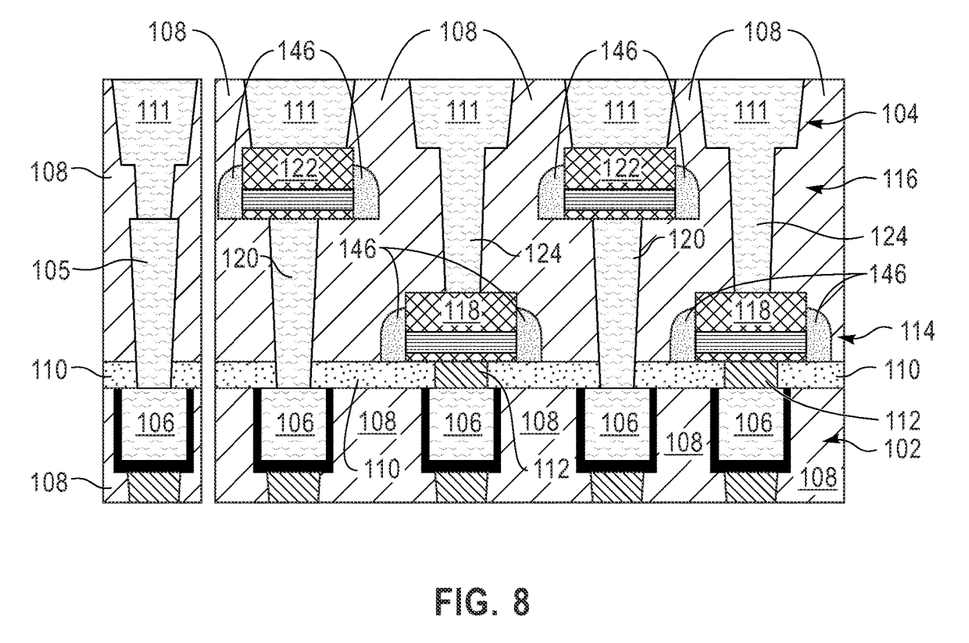
FIG. 8 depicts a schematic cross-sectional diagram of the semiconductor structure of FIG. 3, in accordance with one embodiment of the present invention.

FIG. 8 depicts a schematic cross-sectional diagram revisiting the semiconductor structure of FIG. 1. After the upper MRAM cells 122 are formed, additional ILD 108 is formed around the upper MRAM cells 122, including above the lower MRAM cells 118. The ILD 108 formed around the upper MRAM cells 122 may have the same chemical composition as the other ILD 108, or may have a different chemical composition. Subsequently to ILD 108 deposition, upper vias 124 are formed through the ILD 108 so that the upper vias 124 contact a top of the lower MRAM cells 118. Afterward, trenches 111 of a top metal level 104 are formed.

The upper vias 124 and trenches 111 may be formed using a dual damascene process that is known in the art. FIG. 8, therefore, shows a functional embedded MRAM array in which signals may be sent between the bottom metal level 102 and the top metal level 104 (i.e., between the landing pads 106 and the trenches 111) to change a magnetic orientation of a free magnetic layer within the MRAM cells 118, 122. The magnetic orientation of the MRAM cells 118, 122 may then be used as memory storage for the semiconductor structure 100.

Figure 9:
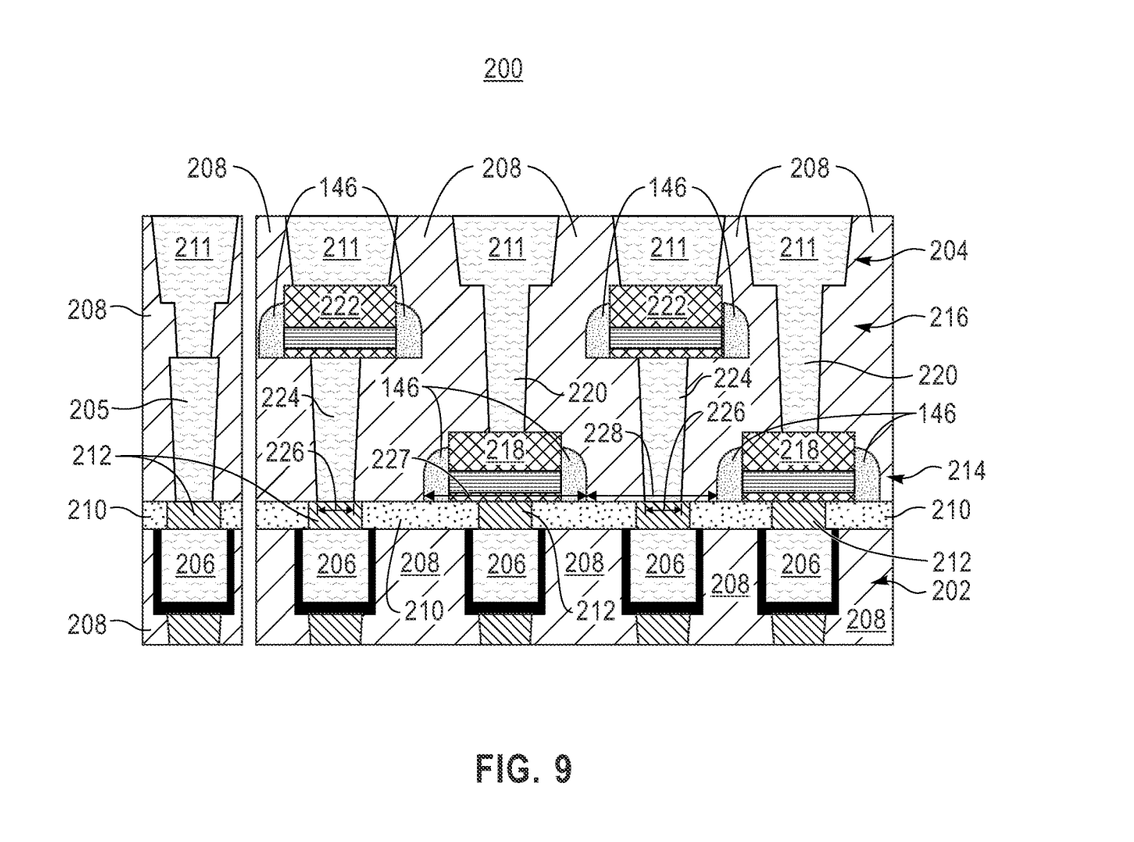
FIG. 9 depicts a schematic view of a semiconductor structure with two metal levels: a bottom metal level and a top metal level, in accordance with one embodiment of the present invention.

FIG. 9 depicts a schematic view of a semiconductor structure 200 with two metal levels: a bottom metal level 202 and a top metal level 204. The metal levels 202, 204 may, for example, be consecutive back-end-of line (BEOL) layers in a logic area of the semiconductor structure 200. The semiconductor structure 200 may include a logic contact 205 that is also positioned between the bottom metal level 202 and the top metal level 204. The bottom metal level 202 includes landing pads 206 that are connected to an additional metal level below the bottom metal level 202, or a front end of line (FEOL) level comprising transistor devices (not shown) located below the bottom metal level 202. The landing pads 206 may be formed of electrically conductive materials such as copper, tungsten, cobalt, ruthenium, aluminum, other metals, or conductive non-metals. The landing pads 206 are insulated from other components by interlayer dielectric (ILD) 208 and a dielectric cap 210. The ILD 208 may include a non-crystalline solid material such as silicon dioxide ($SiO_2$) undoped silicate glass (USG), tetraethyl orthosilicate (TEOS), low-κ dielectric, or ultra low-κ dielectric materials, fluorosilicate glass (FSG), borophosphosilicate glass (BPSG), a spin-on low-κ dielectric layer, a chemical vapor deposition (CVD) low-κ dielectric layer or any combination thereof. The term "low-κ" as used in the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD 208. The use of a self-planarizing dielectric material as ILD 208 may avoid the need to perform a subsequent planarizing step. The dielectric cap 210 may include SiN, SiC, SiCN(H), or other silicon compounds for insulating. The top metal level 204 includes trenches 211 that are also formed of electrically conductive materials such as copper, tungsten, cobalt, ruthenium, aluminum, other metals, or conductive non-metals.

In the illustrated embodiment of FIG. 2, each landing pad 206 includes a contact pad 212 that electrically connects the landing pad 206 to magnetic random access memory (MRAM) components of the semiconductor structure 200. In the illustrated embodiment, the MRAM components include a first tier 214 electrically connected between the bottom metal level 202 and the top metal level 204, and a second tier 216 electrically connected between the bottom metal level 202 and the top metal level 204. The first tier 214 and second tier 216 are separated by ILD 208 (which may have the same chemical composition as the ILD 208 below the dielectric cap 210, or different chemical composition), and are formed to increase the device density for the semiconductor structure 200 without suffering detrimental effects from shadowing of pillars. In certain embodiments, the semiconductor structure 200 may include a third tier, fourth tier, etc. without deviating from the disclosed embodiments.

The first tier 214 includes first (lower) MRAM cells 218 and first (upper) vias 220 above the first MRAM cells 218. The second tier 216 includes second (upper) MRAM cells 222 and second (lower) vias 224 below the second MRAM cells 222. The first tier 214 has the first (lower) MRAM cells 218 directly connected to the contact pads 212, while the second tier 216 has the second vias 224 directly connected to the contact pads 212. The vias 220, 224 have a width 226 that is laterally narrower than a width 227 of the MRAM cells 218, 222, and therefore the vias 220, 224 are able to fit within lateral space 228 between the MRAM cells 218, 222. Specifically, the second (lower) vias 224 fit between the first (lower) MRAM cells 218 and the first (upper) vias 220 fit between the second (upper) MRAM cells 222. The second (upper) MRAM cells 222, therefore, are able to laterally overlap the first (lower) MRAM cells 218, which increases device density. That is, if the first tier 214 and the second tier 216 were both directly connected to the contact pads 212 (i.e., without the second (lower) vias 224), the second (upper) MRAM cells 222 would short to the first (lower) MRAM cells 218 due to the close proximity. Since the first MRAM cells 218 are vertically separated from the second MRAM cells 222 by the ILD 208, however, the MRAM cells 218, 222 do not short, but each landing pad 206 is able to electrically signal an individual MRAM cell 218, 222.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    an embedded magnetic random access memory (MRAM) array electrically connected between a bottom metal level and a top metal level, comprising:
        a first tier comprising first MRAM cells and first vias above the first MRAM cells; and
        a second tier comprising second MRAM cells and second vias below the second MRAM cells.

2. The semiconductor structure of claim 1, wherein the bottom metal level and the top metal level are consecutive back-end-of line (BEOL) layers in a logic area of the semiconductor structure.

3. The semiconductor structure of claim 1, further comprising a front end of line (FEOL) level comprising transistor devices, wherein the FEOL level is located below the bottom metal level.

4. The semiconductor structure of claim 1, further comprising contact pads between the bottom metal level and the first MRAM cells.

5. The semiconductor structure of claim 4, further comprising contact pads between the bottom metal level and the second vias.

6. The semiconductor structure of claim 1, wherein the embedded MRAM array comprises rows and columns, and each row and column alternates between a first MRAM cell and a second MRAM cell.

7. The semiconductor structure of claim 1, wherein the device density of the embedded MRAM array is two times the device density of the first tier, and two times the device density of the second tier.

8. The semiconductor structure of claim 1, wherein the second MRAM cells laterally overlap the first MRAM cells.

9. A method of fabricating a semiconductor structure, comprising:
    forming a lower tier of magnetic random access memory (MRAM) cells above a first set of landing pads of a bottom metal level;
    forming lower vias through a first interlayer dielectric (ILD) covering the first tier of MRAM cells, wherein the lower vias contact a second set of landing pads of the bottom metal level;
    forming an upper tier of MRAM cells on the lower vias;
    covering the upper tier of MRAM cells with a second ILD;
    forming upper vias through the second ILD and the first ILD, wherein the upper vias contact the lower tier of MRAM cells;
    forming a top metal level above the second set of vias and the second tier of MRAM cells.

10. The method of claim 9, wherein the upper tier of MRAM cells laterally overlap the lower tier of MRAM cells.

11. The method of claim 9, further comprising forming contact pads above the first set of landing pads, wherein the lower vias directly contact the second set of landing pads.

12. The method of claim 9, further comprising forming contact pads on the first set of landing pads and the second set of landing pads in the memory array before forming the lower tier of MRAM cells and the lower vias.

13. The method of claim 9, wherein forming the first tier of MRAM cells comprises encapsulating the first tier of MRAM cells and etching back the encapsulation material before covering the bottom metal level and the first tier of MRAM cells with the first ILD.

14. The method of claim 10, further comprising forming the bottom metal level above a front end of line (FEOL) level comprising transistor devices.

15. The method of claim 10, wherein the lower tier of MRAM cells and the upper tier of MRAM cells are arranged in a grid array of rows and columns, and each row and column alternates between a lower tier MRAM cell and a upper tier MRAM cell.

16. A semiconductor structure, comprising:
    a bottom metal level;
    a top metal level;
    a first tier of magnetic random access memory (MRAM) cells electrically connected between the bottom metal level and the top metal level;
    a second tier of MRAM cells electrically connected between the bottom metal level and the top metal level, wherein the second tier of MRAM cells are vertically above the first tier of MRAM cells, and each MRAM cell in the second tier of MRAM cells laterally overlaps at least one MRAM cell in the first tier of MRAM cells.

17. The semiconductor structure of claim 16, further comprising a front end of line (FEOL) level comprising transistor devices, wherein the FEOL level is located below the bottom metal level.

18. The semiconductor structure of claim 16, further comprising contact pads between the bottom metal level and the first tier of MRAM cells.

19. The semiconductor structure of claim 16, wherein the first tier of MRAM cells and the second tier of MRAM cells are arranged in a grid array of rows and columns, and each row and column alternates between a cell from the first tier of MRAM cells and a cell from the second tier of MRAM cells.

20. The semiconductor structure of claim 16, wherein the first tier of MRAM cells and the second tier of MRAM cells comprise an encapsulation spacer.

21. A semiconductor structure, comprising:
    an embedded magnetic random access memory (MRAM) array electrically connected between a bottom metal level and a top metal level, comprising:
        a first tier comprising first MRAM cells formed directly on contact pads connected to landing pads; and
        a second tier comprising second MRAM cells and vias directly contacting the landing pads, wherein the vias pass between the first MRAM cells.

22. The semiconductor structure of claim 21, wherein the second vias comprise a width that is laterally narrower than a width of the first MRAM cells.

23. A semiconductor structure, comprising:
    an embedded magnetic random access memory (MRAM) array electrically connected between a bottom metal level and a top metal level, comprising:
        a first tier comprising first MRAM cells formed directly on contact pads connected to first landing pads of the bottom metal level; and
        a second tier comprising second MRAM cells and vias directly contacting contact pads above second landing pads of the bottom metal level, wherein the vias pass between the first MRAM cells.

24. The semiconductor structure of claim 23, wherein the vias comprise a width that is laterally narrower than a width of the first MRAM cells.

* * * * *